United States Patent [19]

Sato

[11] Patent Number: 5,024,716
[45] Date of Patent: Jun. 18, 1991

[54] PLASMA PROCESSING APPARATUS FOR ETCHING, ASHING AND FILM-FORMATION

[75] Inventor: Yasue Sato, Kawasaki, Japan

[73] Assignee: Canon Kabushiki Kaisha, Tokyo, Japan

[21] Appl. No.: 464,592

[22] Filed: Jan. 12, 1990

Related U.S. Application Data

[63] Continuation of Ser. No. 298,362, Jan. 18, 1989, abandoned.

[30] Foreign Application Priority Data

Jan. 20, 1988 [JP] Japan .................................. 63-10081
Jan. 20, 1988 [JP] Japan .................................. 63-10082

[51] Int. Cl.$^5$ .......................... B44C 1/22; B05B 5/025; B05C 5/02; C23C 14/00
[52] U.S. Cl. .................................... 156/345; 118/50.1; 118/623; 118/728; 156/643; 156/646
[58] Field of Search .............. 156/345, 643, 646, 653, 156/657, 659.1, 662, 668; 118/50.1, 620, 623, 728; 427/38, 39; 204/192.11, 192.32, 298; 252/79.1

[56] References Cited

U.S. PATENT DOCUMENTS 4,761,199 8/1988 Sato ..................................... 156/345
4,776,918 10/1988 Otsubo et al. ....................... 156/345

FOREIGN PATENT DOCUMENTS 60-120525 6/1985 Japan .

Primary Examiner—William A. Powell
Attorney, Agent, or Firm—Fitzpatrick, Cella, Harper & Scinto

[57] ABSTRACT

A plasma processing apparatus includes a vacuum vessel defining a discharge chamber and is provided at least with a source gas supply for supplying a processing gas into the discharge chamber, a magnetic field creating device, and a microwave introducing device. The microwave introducing device employs a microwave radiating member having the shape of a flat plate and provided with a cut. The plasma processing apparatus is capable of uniformly processing a work with a plasma and efficiently applying a microwave only to the work. The periphery of a microwave transmission window is tapered, so that the microwave transmission window can be attached, adhesively and hermetically, to a microwave launcher in a simple construction, whereby the reliability of the adhesive attachment of the microwave transmission window to the microwave launcher is enhanced.

7 Claims, 12 Drawing Sheets

PLASMA PROCESSING APPARATUS FOR ETCHING, ASHING AND FILM-FORMATION

This application is a continuation of application Ser. No. 07/298,362 filed Jan. 18, 1989, now abandoned.

BACKGROUND OF THE INVENTION

1. Field of the Invention

The present invention relates to a plasma processing apparatus and, more specifically, to a plasma processing apparatus suitable for etching, sputtering for depositing a thin layer of metal on a substrate, cleaning a work, ashing, and forming a film on a substrate.

2. Description of the Prior Art

The plasma process is a process in which highly active radicals and ions produced by ionizing a specific material are applied to a work to etch the work, to deposit a film on the work, to deposit a layer of metal on the work by sputtering, to clean the work or to ash the work, and the plasma processing apparatus is used for carrying out such a process.

The conventional plasma processing apparatus comprises a vacuum vessel having a source gas inlet opening and a discharge opening and defining a plasma processing chamber, and a device for generating electromagnetic waves or the like for supplying energy necessary for producing the plasma of the source gas.

The plasma process uses the high energy of the radicals and ions and it is therefore a feature of the plasma process that the plasma process is applicable to various desired processes including etching and film deposition by selectively deciding processing conditions, such as the respective densities of radicals and ions, and the temperature of the work. Efficient production of radicals and ions is essential to the plasma process.

A high-frequency electromagnetic wave of a frequency on the order of 13.56 MHz has been used as an energy medium for producing a plasma. Recently, it has been found that a high-density plasma can be produced by using a microwave of a frequency on the order of 2.45 GHz, and plasma processes employing microwaves have become the object of attention. Several apparatuses for such plasma processes have been proposed.

There have been proposed, for example, a method and an apparatus based on a plasma CVD process using a microwave (hereinafter, referred to as "MW-PCVD process"), for forming an amorphous silicon (hereinafter, referred to as "a-Si") film for optical elements and electronic elements, such as semiconductor devices, electrophotographic sensitized devices, image pickup sensors, image pickup devices and photovoltaic devices.

This MW-PCVD process uses a high-density plasma produced by ionizing neutral molecules by electrons efficiently accelerated by an electric field established by a microwave, and a magnetic field created by a magnetic field creating device disposed outside the discharge chamber. Particularly, determination of the magnetic field intensity so that the cyclotron frequency, namely, a frequency at which electrons traverse, coincides with the frequency of the microwave enables efficient production of a plasma. When the frequency of the microwave is 2.45 GHz, which is used generally, an optimum magnetic field intensity is 875 G (gauss).

The MW-PCVD process is advantageous over the high-frequency plasma process in that the discharge pressure is in the wide range of $10^{-4}$ to 10 torr, and hence, the mean free path of ions is greater than the width of the ion sheath under a low pressure in the range of $10^{-4}$ to $10^{-3}$ torr. Accordingly, when the MW-PCVD process is applied, for example, to an etching apparatus, perpendicular etching is possible because ions fall perpendicularly on the surface of a work. Furthermore, in the MW-PCVD process a large quantity of excited gas can be produced under a pressure in the range of 0.1 to 10 torr, and a work can be processed without being damaged, because the energy of the incident ions is as low as 20 eV.

However, since a microwave is introduced into the discharge chamber through a microwave transmission window, which is small as compared with the sectional area of the discharge chamber, in the conventional plasma processing apparatus, the microwave is absorbed by a plasma prevailing around the microwave transmission window after the plasma has been produced, and hence, it is impossible to produce the plasma uniformly within the discharge chamber.

Incidentally, Japanese Patent Laid-open (Kokai) No. 60-120525 discloses a microwave plasma processing apparatus as shown in FIG. 12. In FIG. 12 there are shown a discharge chamber 1201, a processing chamber 1202, a microwave transmission window 1203, a rectangular waveguide 1204, a plasma current 1205, a plasma transmission window 1206, a work 1207, a work holder 1208, a work table 1209, an evacuating system 1210, a solenoid 1211, a magnetic shield 1212, a first gas supply system 1213, a second gas supply system 1214, and cooling water supply and discharge lines 1215.

In producing a plasma in this microwave plasma processing apparatus, the discharge chamber 1201 and the processing chamber 1202 are evacuated in a high vacuum by the evacuating system 1210, gases or a gas is introduced into the discharge chamber 1201 by the first gas supply system 1213 and/or the second gas supply system 1214 so that the gas pressure in the discharge chamber 1201 is in the range of $10^{-6}$ to 1 torr. A microwave generated by a microwave source, not shown, is introduced through the rectangular waveguide 1204 and the microwave transmission window 1203 into the discharge chamber 1201 and, at the same time, a magnetic field meeting conditions for electron cyclotron resonance is applied at least to a part of the discharge chamber by the solenoid surrounding the discharge chamber 1201. When the microwave source is a magnetron of 2.45 GHz, a magnetic flux density meeting the condition for electron cyclotron resonance is 875 G. The discharge chamber 1201 is constructed so as to meet conditions for a microwave cavity resonator to enhance discharge efficiency. For example, for a cylindrical cavity resonance mode of $TE_{113}$, the discharge chamber 1201 is 17 cm in inside diameter and 20 cm in inside height. To meet conditions for the resonance mode, it is preferable that the microwave transmission window has a comparatively small size. In the conventional microwave plasma processing apparatus, the size of the microwave transmission window is the same as that of the inside section of the waveguide for microwave, ordinarily, a waveguide of 109.22 mm×54.61 mm in inside size (JIS WRJ-2). A plasma produced in the discharge chamber flows through the plasma inlet window 1206 toward the work 1207. After the plasma has been produced, the microwave introduced into the discharge chamber is absorbed by the plasma in the vicinity of the microwave transmission window 1203. This tendency increases as the plasma density increases reducing the propagation of the microwave within the discharge chamber; consequently, it is impossible to produce the plasma uniformly in the discharge chamber, and hence, it is impossible to process the work uniformly. To process the work uniformly by avoiding such a problem, the plasma inlet window 1206 is formed small in size, which entails problems such that the plasma is applied only to a limited area on the surface of the work and that the plasma produced in the discharge chamber cannot be used effectively.

On the other hand, in the fields of microwave communication and radar, which are entirely different from the field relevant to the present invention, an antenna having a flat plate provided with a slot or slit has been developed. Such an antenna is disclosed in F. J. Goebels and K. C. Kelly, IRE Transactions on Antenna and Propagation, AP-9, p. 342, July, 1961. Recently, the development and improvement of antennas have been made for receiving satellite broadcasts and studies relating to such activities are disclosed in N. Goto and M. Yamamoto, Denshi Tsushin Gakkai Gijutsu Kenkyu Hokoku A, pp. 57-80 and p. 43, 1980, and H. Sasazawa, Y. Oshima, H. Sakurai, S. Ando and N. Goto, Denshi Tsushin Gakkai Gijutsu Kenkyu Hokoku A, pp. 86-142 and p. 43, 1986.

However, microwave communication and radars are the principal purposes of those slotted flat plate antennas, and those slotted flat plate antennas are not at all intended for application to producing a plasma.

SUMMARY OF THE INVENTION

Accordingly, it is an object of the present invention to provide an improved plasma processing apparatus eliminating the foregoing problems in the conventional plasma processing apparatus, and capable of efficiently producing a plasma and effectively applying the plasma to etching, ashing and film deposition.

It is a first object of the present invention to provide an improved plasma processing apparatus comprising a vacuum vessel having a discharge chamber, microwave introducing means provided with special microwave radiating means to satisfactorily introduce a microwave into the discharge chamber within the vacuum vessel so that a plasma is produced efficiently in the discharge chamber in a uniform distribution, and capable of efficiently achieving uniform etching or ashing of a work and depositing a uniform film on a substrate by the agency of the plasma produced in the discharge chamber.

It is a second object of the present invention to provide a plasma processing apparatus constructed to direct a microwave from the circumference of a microwave transmission window to the microwave transmission window so that the microwave is radiated perfectly into the discharge chamber of a vacuum vessel, and capable of efficiently producing a plasma in the discharge chamber in a uniform distribution, etching or ashing a work uniformly, and efficiently depositing a uniform film on a substrate.

Thus, the present invention solves the foregoing problems in the conventional plasma processing apparatus.

In a first aspect of the present invention, an improved plasma processing apparatus comprises a vacuum vessel having a discharge chamber and provided at least with source gas introducing means, magnetic field creating means and microwave introducing means employing a flat microwave radiating member having a cut.

In a second aspect of the present invention, a plasma processing apparatus comprises a vacuum vessel having a discharge chamber; source gas supply means for supplying a source gas into the discharge chamber; magnetic field creating means; microwave source means; and microwave propagating and introducing means for propagating a microwave generated by the microwave source means and introducing the microwave into the discharge chamber; characterized in that the microwave propagating and introducing means is contained in a conductive housing, means for propagating a microwave from the periphery toward the center of the microwave transmission window is provided in a transmission line extending from the microwave source means, and a flat microwave radiating member having a cut is attached to the inner surface of the microwave transmission window exposed to the discharge chamber to completely radiate the microwave being propagated from the periphery toward the center of the microwave transmission window through the cut into the discharge chamber before the microwave reaches the center of the microwave transmission window.

BRIEF DESCRIPTION OF THE DRAWINGS

The above and other objects, features and advantages of the present invention will become more apparent from the following description taken in conjunction with the accompanying drawings, in which.

DETAILED DESCRIPTION OF THE PREFERRED EMBODIMENTS

Figure 1:
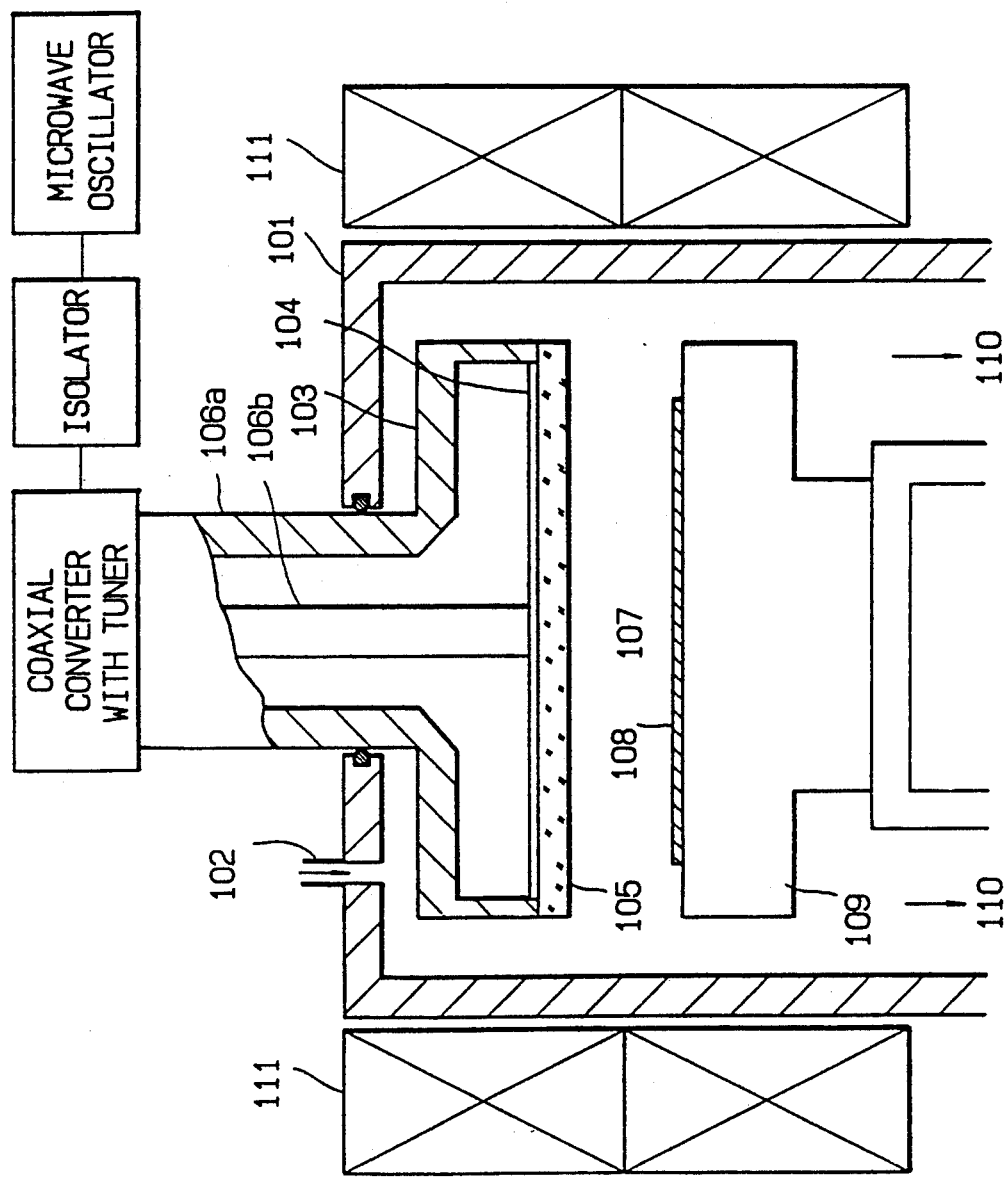
FIG. 1 is a sectional view of a plasma processing apparatus in a first aspect of the present invention.
Figure 2:
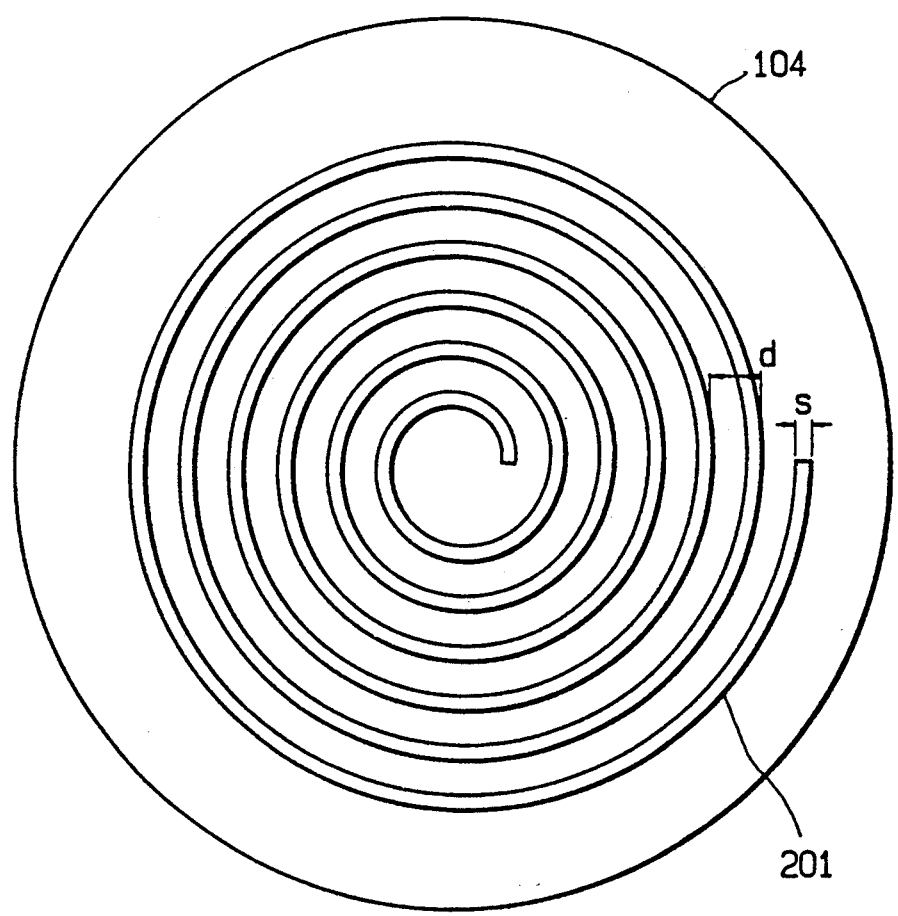
FIG. 2 is a plan view of a mask having a spiral slit.

Referring to FIG. 1 showing a plasma processing apparatus in a first aspect of the present invention, there are shown a vacuum vessel 101 defining a vacuum chamber, a gas inlet port 102 through which a processing gas is introduced into the vacuum vessel 101, a microwave launcher 104 which radiates a microwave; a discharge chamber 107 in which a plasma is produced, a mask 104 formed of a conductive flat plate provided with a spiral slit 201 as shown in FIG. 2, for radiating a microwave through the spiral slit 201 into the discharge chamber 107, a microwave transmission window 105 formed of a dielectric, such as quartz, alumina, boron nitride, or forsterite, and hermetically sealing the microwave launcher 103 in the discharge chamber 107, an outer tubular conductor 106a for transmitting a microwave to the microwave launcher 103, an inner conductor 106b disposed coaxially with the outer tubular conductor 106a and having one end joined to the center of the mask 104, a work 108, a work holder 109, an evacuating system 110 for maintaining the pressure within the discharge chamber at a working pressure, and air-core coils 111 for creating a magnetic field within the discharge chamber 107.

A microwave, ordinarily a microwave of 2.45 GHz in frequency, generated by a microwave oscillator is guided to an isolator for absorbing a microwave returning to the microwave oscillator by a waveguide, the microwave is transmitted to a coaxial converter with a tuner for matching the microwave launcher 103, and then, the microwave is transmitted through the coaxial tube to the microwave launcher 103. A processing gas, for example, $Cl_2$ gas for etching an Si substrate, $SiH_4$ gas for forming an a-Si film or $O_2$ gas for resist ashing, is introduced through the gas inlet port 102 into the discharge chamber 107. The microwave is radiated through the slit 201 of the mask 104 into the discharge chamber 107. Thus, a plasma is produced efficiently by the combined magnetron effect of the electric field of the microwave and the magnetic field created by the air-core coils 111. The magnetic field intensity is determined depending on the frequency of the microwave so as to meet an electron cyclotron resonance condition. For example, the magnetic field intensity is 875 G when the frequency of the microwave is 2.45 GHz. When the magnetic field intensity meets such a condition, electrons are heated by a resonance effect, whereby the plasma producing efficiency is further enhanced The work 108 is processed by ions and radicals contained in the plasma of the processing gas produced in the discharge chamber 107.

Plasma density, temperature and the valence of the ions, which are significant factors affecting the work processing effect, are dependent on the intensity of the radiated microwave. Accordingly, the intensity distribution of the radiated microwave must be uniform in a plane parallel to the surface of the work 108 to process the entire surface of the work 108 satisfactorily uniformly. Uniform intensity distribution can be achieved by properly determining the width S and pitch d of the spiral slit 201 (FIG. 2). For example, when the intensity of the microwave is high in the central region of the mask 104, the pitch d of the spiral slit 201 is increased in the central region of the mask 104, while the pitch d is diminished in the peripheral region of the mask 104. The width S of the spiral slit may be varied between the central region and peripheral region of the mask 104 in a similar manner for the same purpose. The mask 104 need not necessarily be provided with the spiral slit, but may be provided with any suitable slit or slits, such as a plurality of concentric circular slits or a plurality of cross slots.

As mentioned above, the microwave is absorbed by the plasma prevailing around the microwave transmission window 105 within the discharge chamber 107 after the plasma has been produced. However, since the direction of the magnetic flux density of the magnetic field created by the air-core coils 111 is perpendicular to the surface of the work 108, the plasma is scarcely diffused in a direction perpendicular to the surface of the work 108, moves along the magnetic field in a direction perpendicular to the surface of the work 108, and reaches the surface of the work 108 efficiently for processing the work 108.

The work holder 109 is disposed at a position where the magnetic field intensity is on the order of $\frac{1}{2}$ to 1/10 of the maximum magnetic field intensity so that the plasma is diffused and accelerated sufficiently before reaching the surface of the work 108, whereby the processing effect of the plasma is enhanced.

Figure 3:
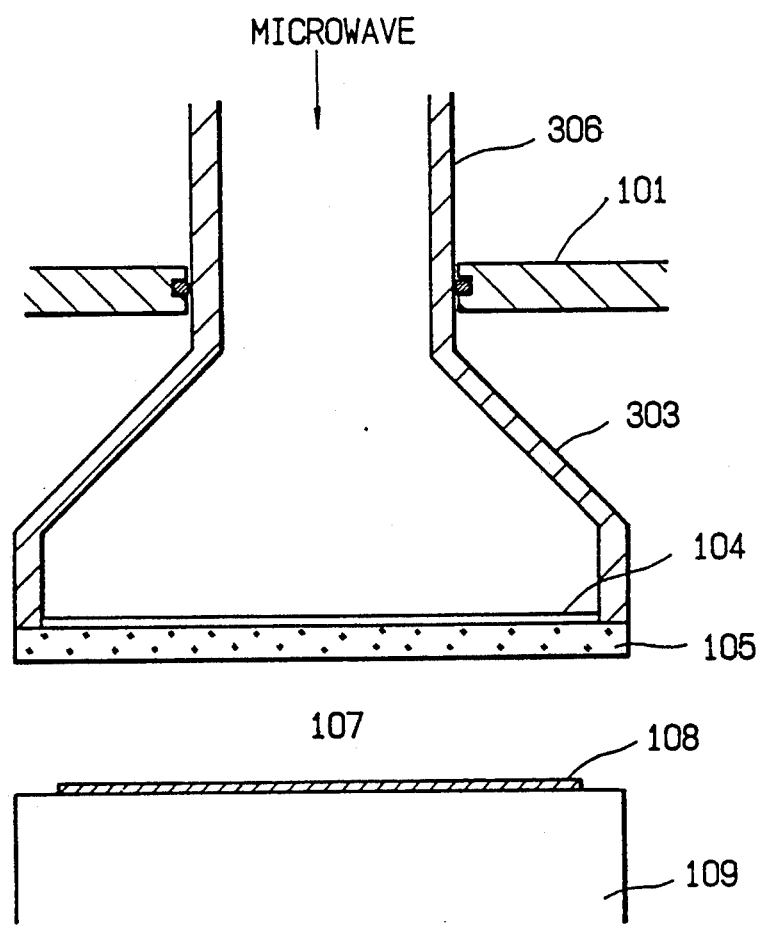
FIG. 3 is a fragmentary sectional view of a microwave supply unit having a waveguide.

Means for transmitting the microwave to the microwave launcher 103 is not limited to the coaxial tube. FIG. 3 shows an arrangement employing a waveguide in transmitting the microwave to the microwave launcher 103, in which parts like or corresponding to those shown in FIG. 1 are denoted by the same reference numerals. Shown in FIG. 3 are a microwave launcher 303 and a waveguide 306 for guiding the microwave to the microwave launcher 303.

Referring to FIG. 3, the microwave generated by a microwave oscillator, not shown, is guided by the waveguide 306 to the microwave launcher 303. Reflected waves are absorbed by a circulator, and the microwave is matched with the load by a tuner. The microwave is radiated into a discharge chamber 107 through a mask 104 with a slit as shown in FIG. 2 to produce a plasma for processing a work 108 by an action similar to that explained with reference to the foregoing embodiment.

Figure 4:
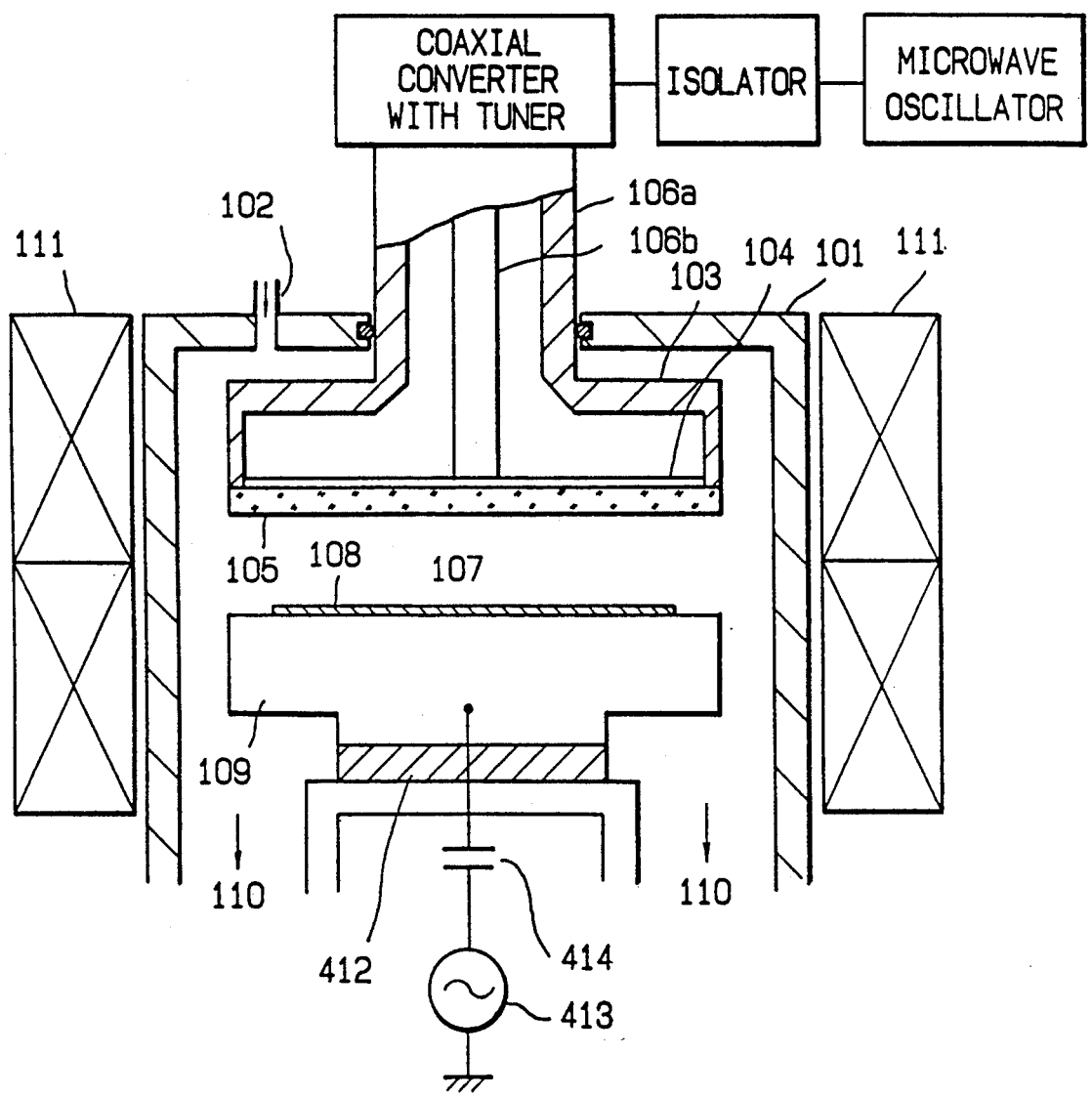
FIG. 4 is a sectional view of a high-frequency power source for supplying a high-frequency power to a work holder.

FIG. 4 shows a high-frequency power source as the next embodiment for supplying high-frequency power to a work holder 109, in which parts like or corresponding to those previously described with reference to FIG. 1 are denoted by the same reference numerals. Shown in FIG. 4 are an insulator 412 electrically insulating the work holder 109, a high-frequency power source 413 for supplying high-frequency power to the work holder 109, and a capacitor 414 for the dc floating of the work holder 109.

In operation, a plasma is produced in the discharge chamber 107 by a microwave in the same manner as that employed in the foregoing embodiment. At the same time, the high-frequency power source 413 supplies high-frequency power to the work holder 109. Since the work holder 109 is dc-floated by the capacitor 414, the work holder 109 is biased at a negative potential. Then, the ions are accelerated by the bias voltage toward a work 118 to promote the processing action of the ions. Ion energy is dependent on the bias voltage; which in turn is dependent on the high-frequency power. Accordingly, the ion energy can be controlled by the high-frequency power.

When the apparatus is applied to etching, for example, to etching $SiO_2$ requiring relatively high ion energy, ion energy is controlled so that the work is etched at a moderate etching rate without being damaged by the ions impinging on the work. In depositing $SiO_2$ in a film, a film is formed while etching is performed at a moderate etching rate so that a smooth film is formed.

Figure 5:
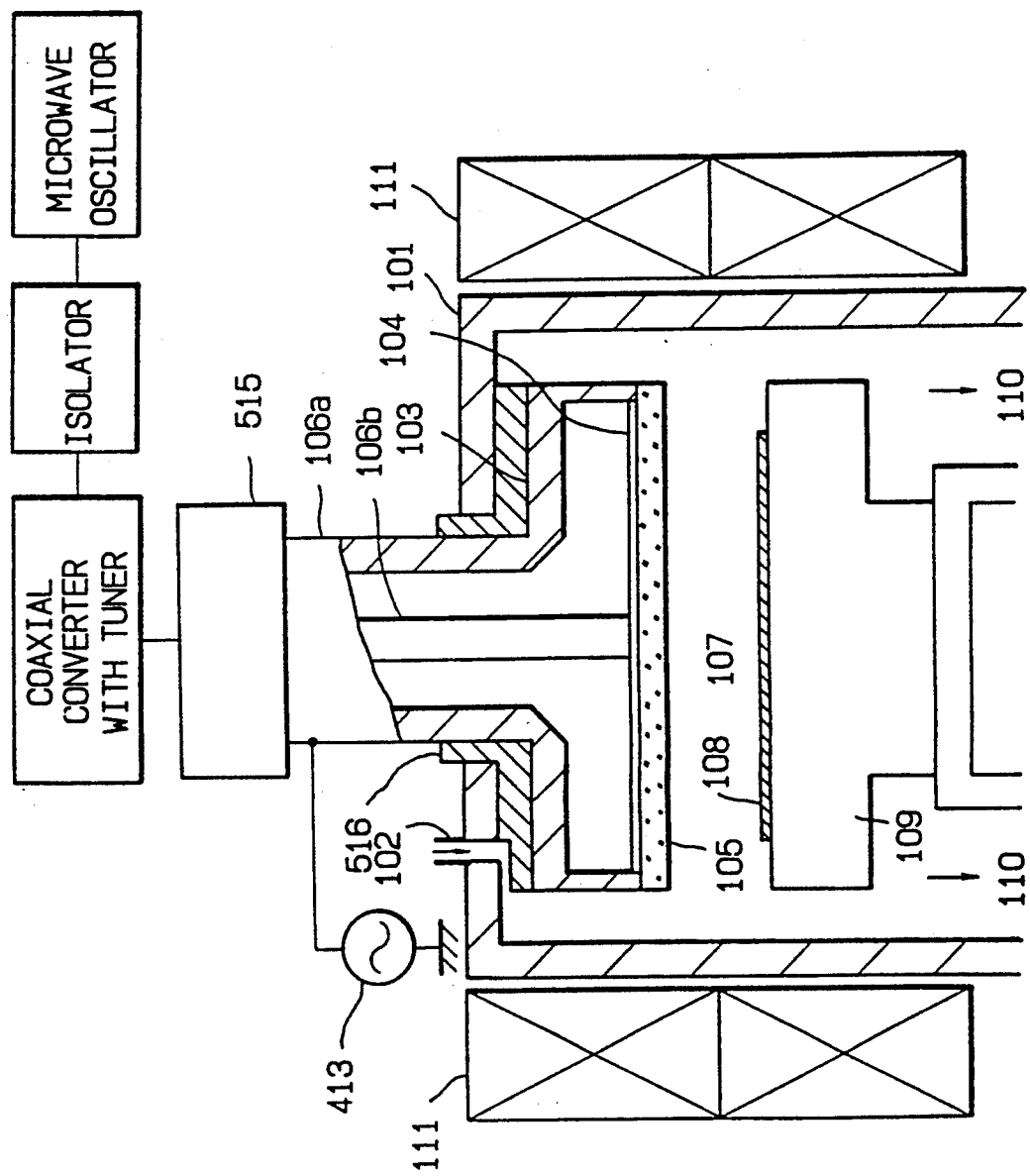
FIG. 5 is a sectional view of a high-frequency power source for supplying high-frequency power to a microwave launcher.

The frequency of the high-frequency power is 2 to 3 MHz or higher. Ordinarily, high-frequency power with a frequency of 13.56 MHz, i.e., an industrial high-frequency, is used to enable the control of the ion energy by the bias voltage. On the other hand, it is impossible to control the ion energy by the bias voltage when the frequency of the high-frequency power is lower than 2 to 3 MHz. However, when the ions are accelerated directly by a high-frequency electric field, the ion energy can be controlled similarly. Ordinarily, the frequency is in the range of 100 KHz to 500 KHz. In such a case, high-frequency power may be supplied to the microwave launcher 103 instead of the work holder 109 disposed opposite to the microwave launcher 103, because, ordinarily, the pitch d of the slit is 100 cm or less and the width S of the slit is 1 cm or less, and hence, the mask 104 can be regarded as a flat plate in dealing with high-frequency wave ($\leq 13.56$ MHz). FIG. 5 shows another embodiment, in which parts like or corresponding to those described with reference to FIGS. 1 and 4 are denoted by the same reference numerals. Shown in FIG. 5 is a plasma processing apparatus having an impeding device 515, such as a choke generally employed in a microwave circuit, to impede the propagation of high-frequency waves to a coaxial converter with a tuner, a microwave launcher 103, and an insulator 516 for electrically insulating the microwave launcher 103. The operation of the plasma processing apparatus shown in FIG. 5 will be described hereinafter. A plasma is produced in the discharge chamber 107 by a microwave in the same manner as that employed in the embodiment shown in FIG. 4. High-frequency power is supplied from the high-frequency power source 413 to the microwave launcher 103 to establish high-frequency electric field across the conductive mask 104—the plasma—the work holder 109 (or the work 108). Ions are accelerated by the electric field for efficient etching, ashing or film formation.

In the foregoing two embodiments, in which high-frequency power is supplied to the plasma processing apparatus, the conductive mask 104 and the work holder 109 function as the opposite electrodes of a reactor of the parallel flat plate type; consequently, a uniform high-frequency electric field is established across the mask 104—plasma—work holder 109, so that uniform etching, ashing or film formation can be achieved.

Figure 6:
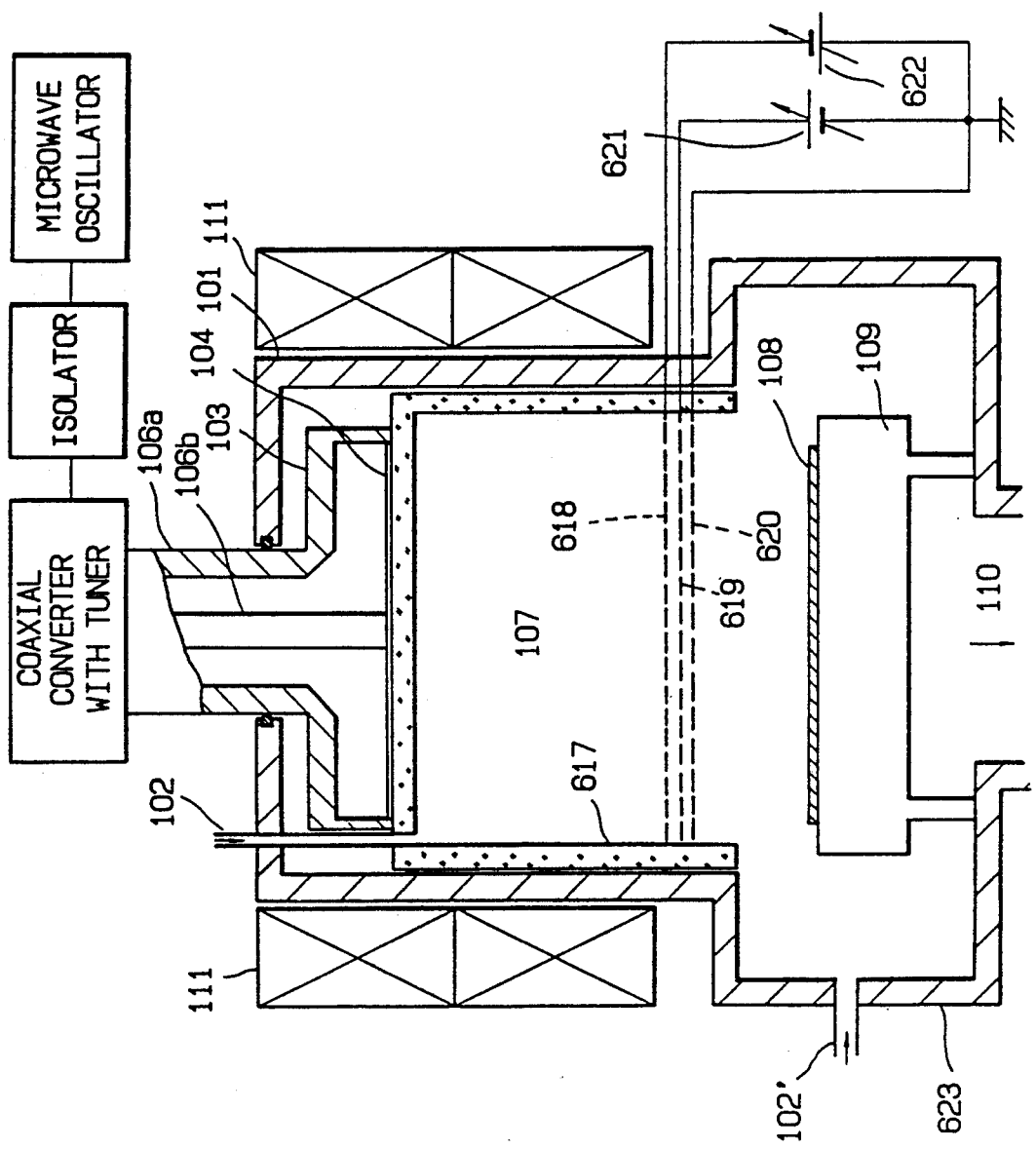
FIG. 6 is a sectional view of an ion drawing unit for drawing ions from a discharge chamber.

FIG. 6 shows a plasma processing apparatus in a further embodiment according to the present invention, in which ions are drawn out from a plasma produced in a discharge chamber 107 by a plurality of electrodes.

Shown in FIG. 6 are an inner insulating casing 617 for insulating a plasma produced in the discharge chamber 107 from a vacuum vessel 101, formed of a material capable of transmitting microwaves, such as quartz, alumina, boron nitride or forsterite, ion drawing electrodes 618, 619 and 620 each having a plurality of openings optically aligned with those of the other ion drawing electrodes, dc power supplies 621 and 622 for applying dc voltage to the ion drawing electrodes 619 and 618, respectively, a processing chamber 623, and a gas inlet port 102' for supplying a gas into the processing chamber 623.

The operation of the plasma processing apparatus shown in FIG. 6 will be described hereinafter. A microwave radiated through the slit or slot of the conductive mask 104 is transmitted through the inner insulating casing 618 to the discharge chamber 107.

Then, a processing gas, for example, nitrogen gas for depositing SiN in a film on an Si substrate, is introduced through the processing gas inlet port 102 into the discharge chamber 107, and $SiH_4$ gas is introduced through the gas inlet port 102' into the processing chamber. A plasma is produced in the discharge chamber 107 in the same manner as that employed in the apparatus shown in FIG. 1. The plasma diffuses along magnetic lines of force and reaches the ion drawing electrode 618. The ions, principally, $N^+$ ions and $N_2^+$ ions, absorb energy from the ion drawing electrode 618 to which a voltage is applied by the dc power supply 622. The dispersion of the ions is controlled by the voltage applied to the ion drawing electrode 619. The ions reaching the surface of the work 108 held by the work holder 109 react with $SiH_4$ to form a SiN film on the surface of the work 108. The plasma processing apparatus need not necessarily be provided with the three ion drawing electrodes as shown in FIG. 6, but may be provided with one or two ion drawing electrodes for the same effect.

The distribution of the ions drawn out from the discharge chamber 107 is greatly dependent on the distribution of the ions in the discharge chamber 107. A uniform plasma can be produced by radiating a microwave through the conductive mask 104 with a slit, consequently, uniform ion beams can be obtained. Thus, under a pressure on the order of $10^{-4}$ torr, the ion beams travel in the same direction and reach the work to etch the work in the direction of travel of the ion beams for anisotropic etching.

Figure 7:
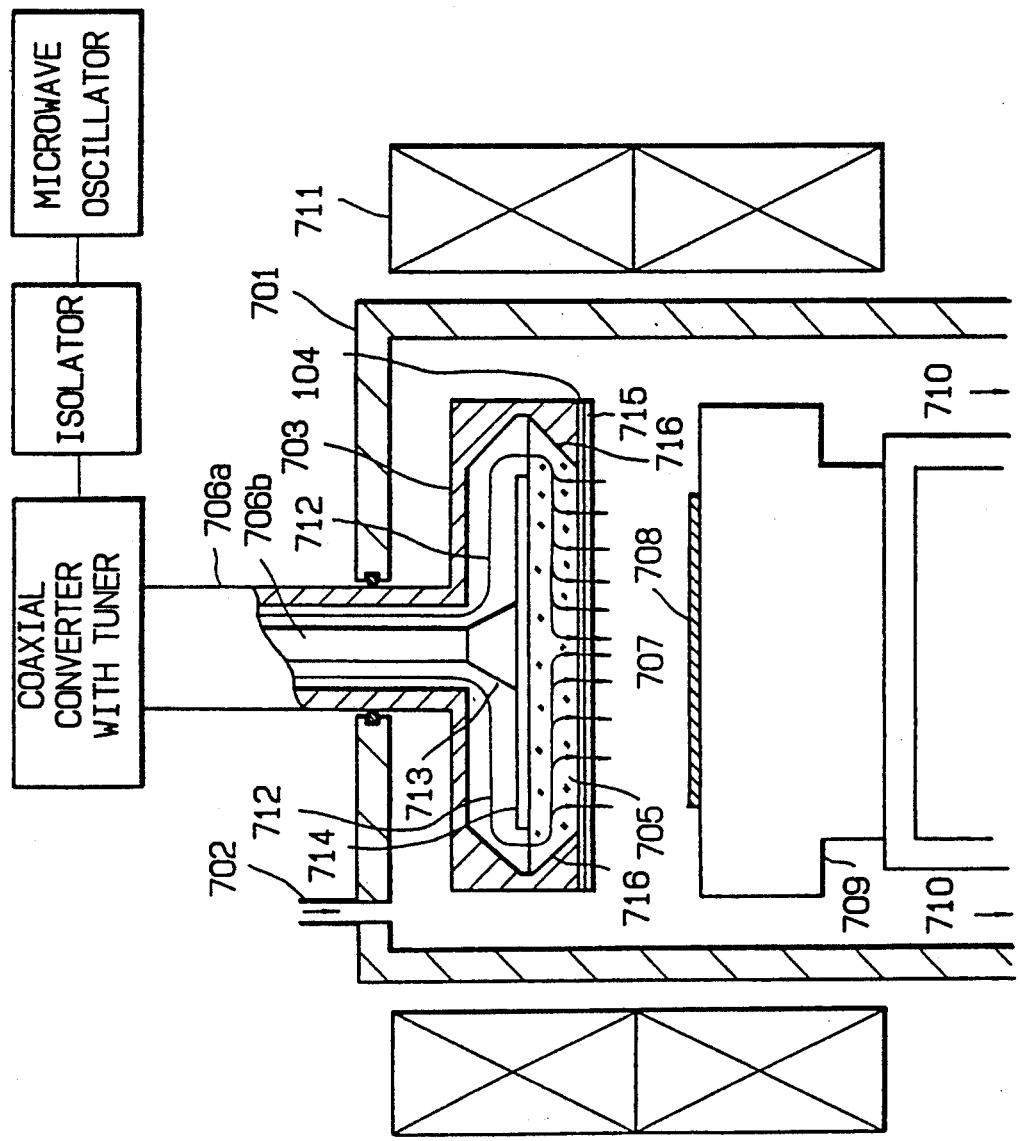
FIG. 7 is a sectional view of a plasma processing apparatus in a second aspect of the present invention.

FIG. 7 shows a most typical plasma processing apparatus in the second aspect of the present invention in a cross section. Shown in FIG. 7 are a vacuum vessel 701 defining a vacuum processing chamber, a gas inlet port 702 for introducing a processing gas into the vacuum vessel, a microwave launcher 703 for radiating a microwave, a discharge chamber 707 in which a plasma is produced, a mask 704 in the form of a conductive flat plate with a slit, for radiating a microwave into the discharge chamber 707, a microwave transmission window 705 formed of a dielectric material, such as quartz, alumina, boron nitride or forsterite, to seal the microwave launcher 703 so that the interior of the microwave launcher 708 is hermetically isolated from the discharge chamber 707, a tubular outer conductor 706a, an inner conductor 706b extended coaxially within the tubular outer conductor 706a to form a coaxial tube, a work 708, a work holder 709, an evacuating system 710 to maintain the discharge chamber at a processing pressure, air-core coils 711 to create a magnetic field within the discharge chamber 707, a microwave propagating path 712, a taper member 713 for suppressing the reflection of a microwave, a conductive plate 714 for a two-layer construction, a microwave-transmissive insulating plate 715 to prevent the direct contact of the plasma with the conductive plate 714, and a wall 716 hermetically holding the microwave transmission window 705.

The conductive mask 704 with a slit is the same as the mask 104 shown in FIG. 2 by way of example and employed in the plasma processing apparatus shown in FIG. 1.

A microwave (ordinarily, a microwave of 2.45 MHz) generated by a microwave oscillator is guided to an isolator which absorbs a microwave reflected to the microwave oscillator and further to a coaxial converter with a tuber for matching the microwave with the microwave launcher 703 by a waveguide, and then, the microwave is transmitted to the microwave launcher 703. On the other hand, a processing gas, for example, $Cl_2$ gas for etching an Si substrate, $SiH_4$ gas for depositing a-Si in a film, or $O_2$ gas for ashing a resist, is supplied through the gas inlet port 702 into the discharge chamber 707. The microwave travels downward within the microwave launcher 703 along the microwave propagating path 712, since the microwave transmission window 705 is disposed at the bottom of the microwave launcher 703. The wavelength of the microwave becomes $1/\sqrt{\epsilon_r}$ ($\epsilon_r$ is the specific inductive capacity of the material forming the microwave transmission window 705) of the original wavelength. Since the length of the slit or slot is dependent on the wavelength of the microwave, the length of the slit or slot can be reduced by properly selecting a material for forming the microwave transmission window 705. Materials suitable for forming the microwave transmission window 705 are those less absorbent of microwaves, such as quartz, alumina, boron nitride and forsterite, and those having a large dielectric constant, such as ceramics of a Zr-TiO system, a Sn-TiO system, a BaO-TiO$_3$ system and a complex perovskite system. The size of the microwave transmission window 705 is dependent on the purpose and scale of the plasma processing apparatus.

The microwave transmission window 705 is in contact with the inner surface of the wall 716 of the microwave launcher 703. Since the microwave transmission window 705 must be joined hermetically to the wall 716, the microwave transmission window 705 is attached adhesively and hermetically to the wall 716 by a microwave-transmissive adhesive. Since the wall 716 is pressed against the microwave transmission window 705 by the atmospheric pressure, the adhesive strength of the adhesive need not be very high. A silicon resin adhesive is one of the preferable adhesives.

The microwave is transmitted through the microwave transmission window 705 held between the mask 704 with a slit as shown in FIG. 2 and the conductive plate 714, and then, the microwave is radiated gradually through the slit 201. The microwave thus radiated passes the insulating plate 715 into the discharge chamber 707 to establish a microwave electric field within the discharge chamber 707. Then, a plasma is produced by the combined magnetron affect of the electric field and a magnetic field created by the air-core coils 711. Electrons are accelerated resonantly to produce the plasma further efficiently when the magnetic field intensity is determined so that the cyclotron frequency and the frequency of the microwave coincide with each other, for example, a magnetic field intensity of 875 G when the frequency of the microwave is 2.45 GHz.

The insulating plate 715 is provided to prevent the contamination of the work by atoms or groups of atoms ejected from the surface of the conductive plate as the result of direct contact of the plasma with the surface of the conductive plate. The insulating plate 715 is formed of a material which is less absorbent of microwaves and will not be a source for contaminating the work, for example, quartz for etching Si or SiO and for depositing a-Si in a film, or alumina for etching alumina. The distribution of the radiated microwave determining the spatial distribution of the process can be controlled by selectively determining the width S and pitch d of the slit 201 formed in the mask 704. For example, the pitch d is increased in the central region of the mask 704 and is diminished in the peripheral region of the same when the intensity of the microwave is high in the central region and low in the peripheral region. The width S of the slit 201 may be varied similarly. The slit need not be limited to the spiral slit 201, but may be of any suitable shape, such as concentric circular slits or a plurality of cross slots, for the same effect.

As mentioned above, the microwave is absorbed by the plasma prevailing in the vicinity of the microwave transmission window 705 after the plasma has been produced. However, since the direction of the magnetic field density of the magnetic field created by the air-core coils 711 is perpendicular to the surface of the work 708, the plasma is scarcely diffused in a direction perpendicular to the surface of the work 708, and reaches the surface of the work 708 efficiently for processing the work 708.

The work holder 709 is disposed at a position where the magnetic field intensity is on the order of $\frac{1}{2}$ to 1/10 of the maximum magnetic field intensity so that the plasma is sufficiently diffused and accelerated by the magnetic field before reaching the surface of the work 708, whereby the processing effect of the plasma is enhanced.

Figure 8:
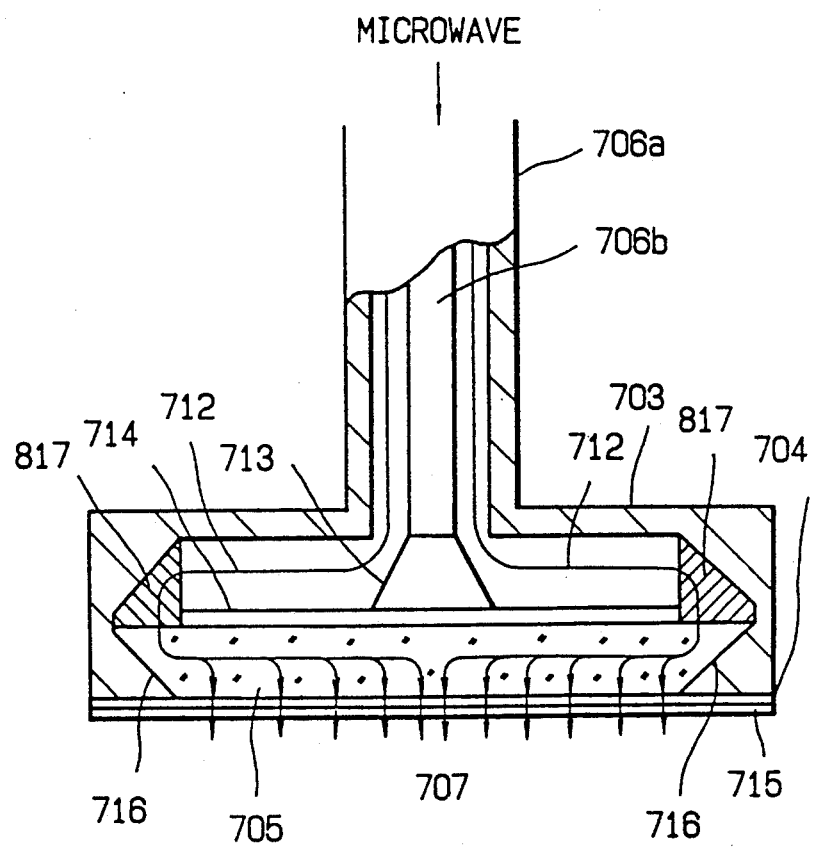
FIG. 8 is a sectional view of a microwave launcher provided with an annual dielectric member disposed at a microwave receiving part of a microwave transmission window.

In the foregoing embodiment, when a dielectric ring 817 formed of a dielectric material, such as alumina, quartz, boron nitride, forsterite, tetrafluoroethylene resin or polystyrene resin, is put on the periphery of the conductive plate 714 as shown in FIG. 8, the guide wavelength of the microwave can be diminished to $1/\sqrt{\epsilon_r}$ ($\epsilon_r$ is the specific dielectric constant of the dielectric material) of the original wavelength, whereby the microwave can easily be propagated downward. When the dielectric ring 718 is formed of the same material as that of the microwave transmission window 705, the dielectric ring 718 may be formed integrally with the microwave transmission window 705.

Figure 9:
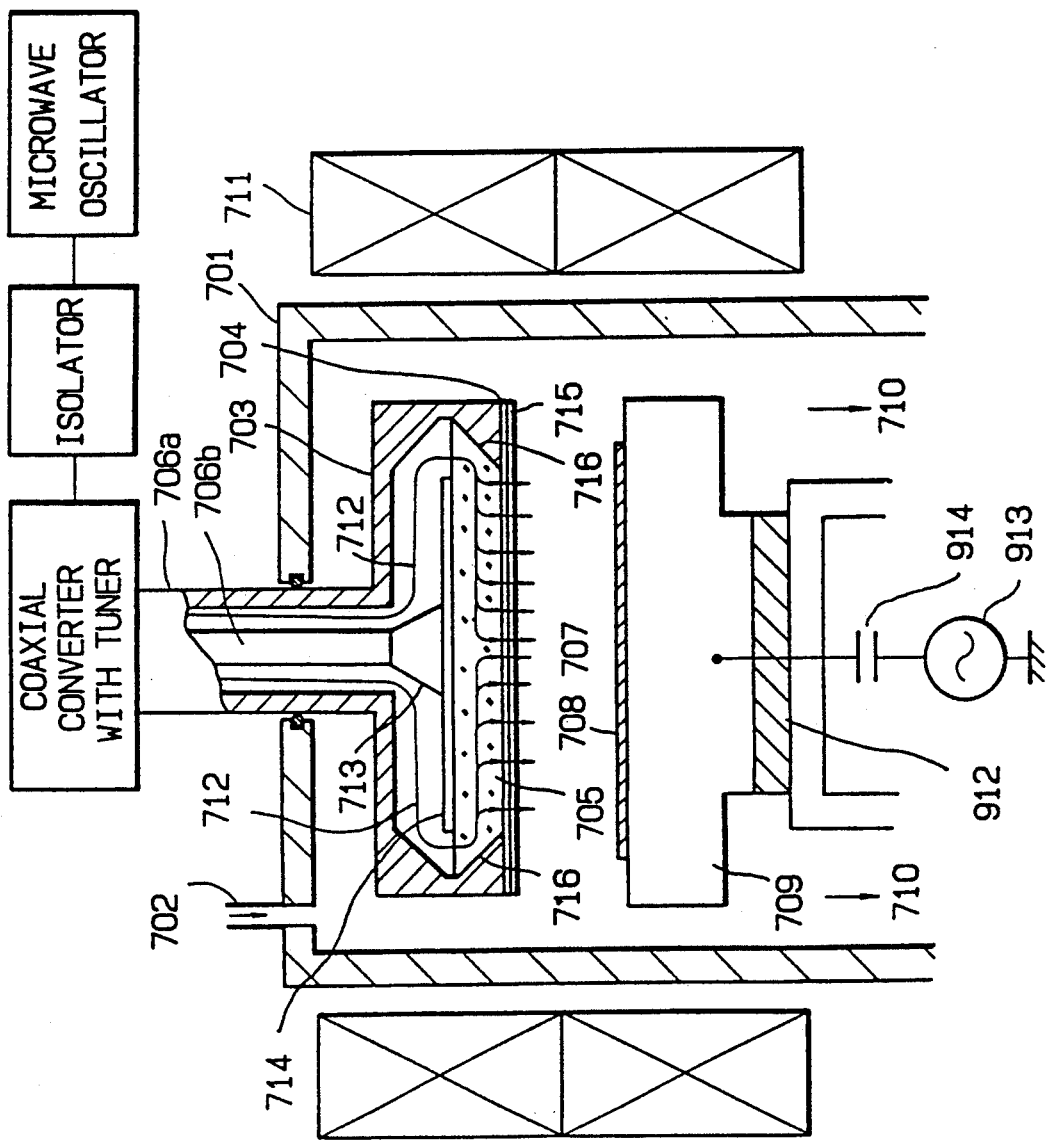
FIG. 9 is a sectional view of a high-frequency power source for supplying high-frequency power to a work holder.

FIG. 9 shows a plasma processing apparatus in a further embodiment according to the present invention, having a high-frequency power source for supplying high-frequency power to a work holder 709, in which parts like or corresponding to those described with reference to FIG. 7 are denoted by the same reference numerals. Shown in FIG. 9 are an insulating member 912 for electrically insulating the work holder 709, high-frequency power source 913 for supplying high-frequency power to the work holder 709, and a capacitor 914 for the dc floating of the work holder 709.

In operation, a plasma is produced in the discharge chamber 707 by a microwave in the same manner as that employed in the foregoing embodiment. At the same time, high-frequency power is supplied to the work holder 709. Since the work holder 709 is dc-floated, the work holder 709 is biased at a negative potential; consequently, ions are accelerated by the bias voltage toward the work 708 to enhance the etching effect of the ions. The energy of the ions is dependent on the bias voltage, which in turn is dependent on the high-frequency power, and hence, the energy of the ions can be controlled by controlling the high-frequency power.

When the plasma processing apparatus is applied to etching, for example, for etching SiO$_2$ requiring a relatively high ion energy, the ion energy is controlled so that the work 708 is not damaged by ion impact and the work 708 is etched at an appropriate etching rate. In depositing SiO$_2$ in a film, the ion energy is controlled so that SiO$_2$ is deposited in a film while the film is etched properly by ion impact, whereby a flat and smooth film can be formed.

The frequency of the high-frequency power is 2 to 3 MHz or above. High-frequency power with a frequency of 13.56 MHz, i.e., an industrial high frequency, is used to enable the control of the ion energy by the bias voltage. When the frequency of the high-frequency power is 2 to 3 MHz or lower, the ion energy cannot be controlled by the bias voltage. However, since the ions are accelerated directly by the high-frequency electric field, the ion energy can be controlled. Ordinarily, the frequency is in the range of 100 to 500 kHz. In such a case, the high-frequency power may be supplied to the microwave launcher 703 disposed opposite to the work holder 709, because, ordinarily, the pitch d of the slit is 100 cm or below and the width S of the slit is 1 cm or below and hence, the mask 714 can be regarded as a flat plate in dealing with a high-frequency wave ($\leq 13.56$ MHz).

Figure 10:
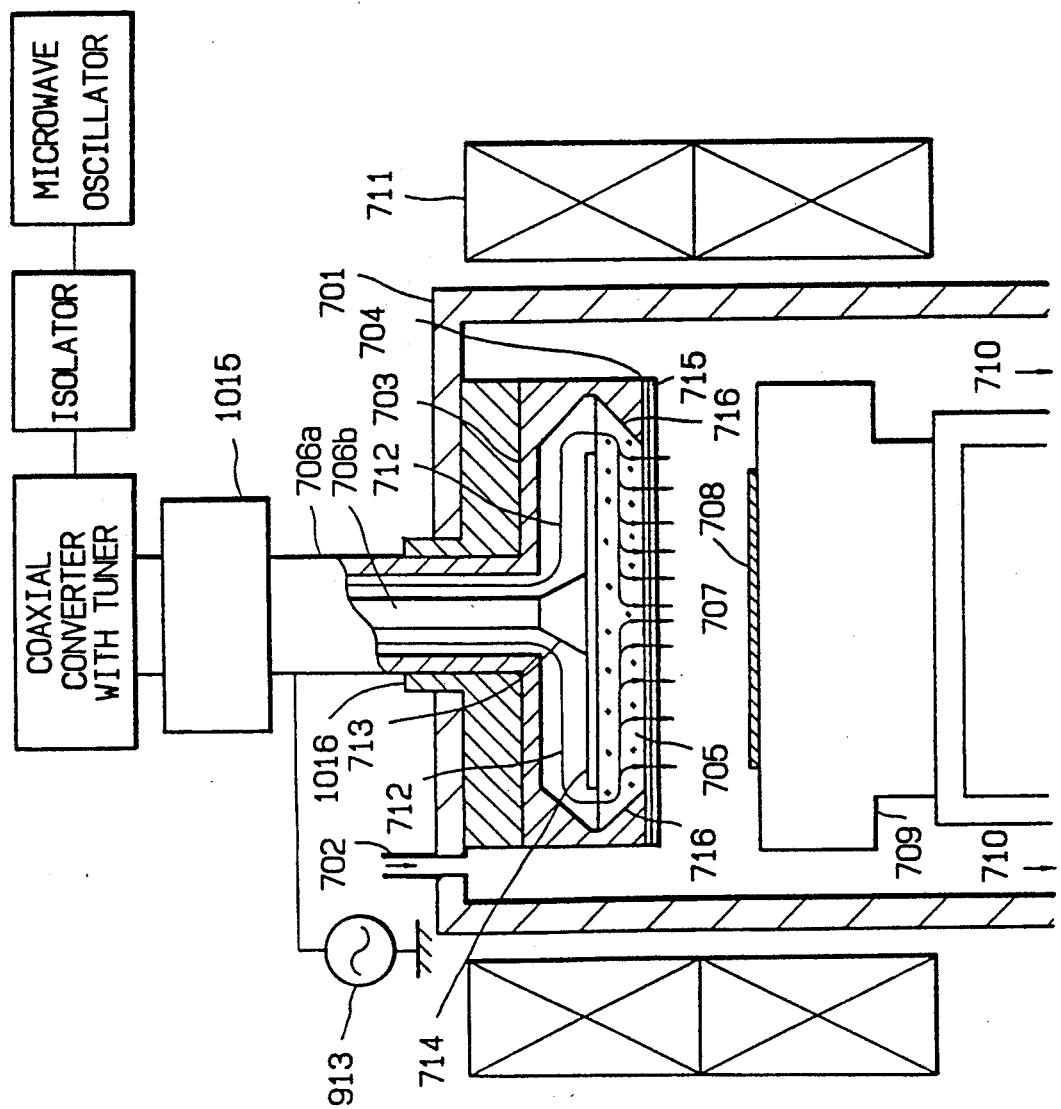
FIG. 10 is a sectional view of a high-frequency power source for supplying high-frequency power to a microwave launcher.

FIG. 10 shows a plasma processing apparatus in still a further embodiment according to the present invention, in which parts like or corresponding to those previously described with reference to FIGS. 7 and 9 are denoted by the same reference numerals. Shown in FIG. 10 are an impeding device 1015, such as a choke generally used in a microwave circuit, for impeding the propagation of high-frequency waves toward a coaxial converter with tuner, a microwave launcher 703, and an insulating member 1016 for insulating the microwave launcher 703 from a vacuum vessel 701.

In operation, a plasma is produced in the discharge chamber 707 in the same manner as that employed in the plasma processing apparatus shown in FIG. 9, and high-frequency power is supplied to the microwave launcher 703 by the high-frequency power source 913 to establish a high-frequency electric field across the conductive mask 704—the plasma—the work holder 709 (or the work 708). Then, ions are accelerated by the high-frequency electric field for efficient etching, ashing or film formation.

In the foregoing two embodiments, in which the high-frequency power is supplied simultaneously with microwave generation, the conductive mask 704 and the work holder 709 serve as the opposite electrodes of a reactor of a parallel flat plate type. Accordingly, a uniform high-frequency electric field is established across the mask 704—the plasma—work holder 709, so that uniform etching, ashing or film formation can be achieved, whereas the apparatus not having any opposite flat plate electrodes is unable to establish a uniform electric field.

Figure 11:
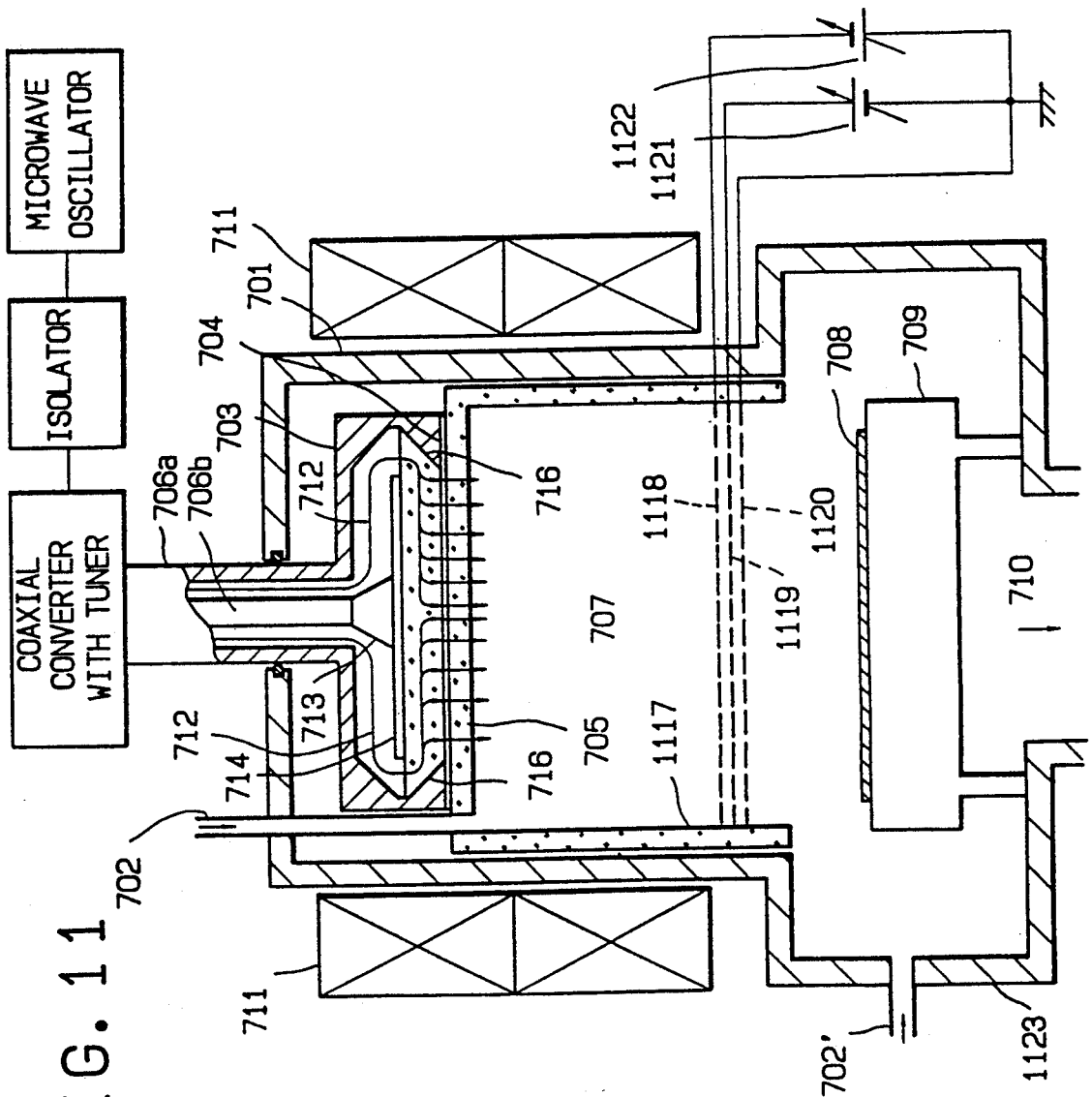
FIG. 11 is a sectional view of an ion drawing unit for drawing ions from a discharge chamber.
Figure 12:
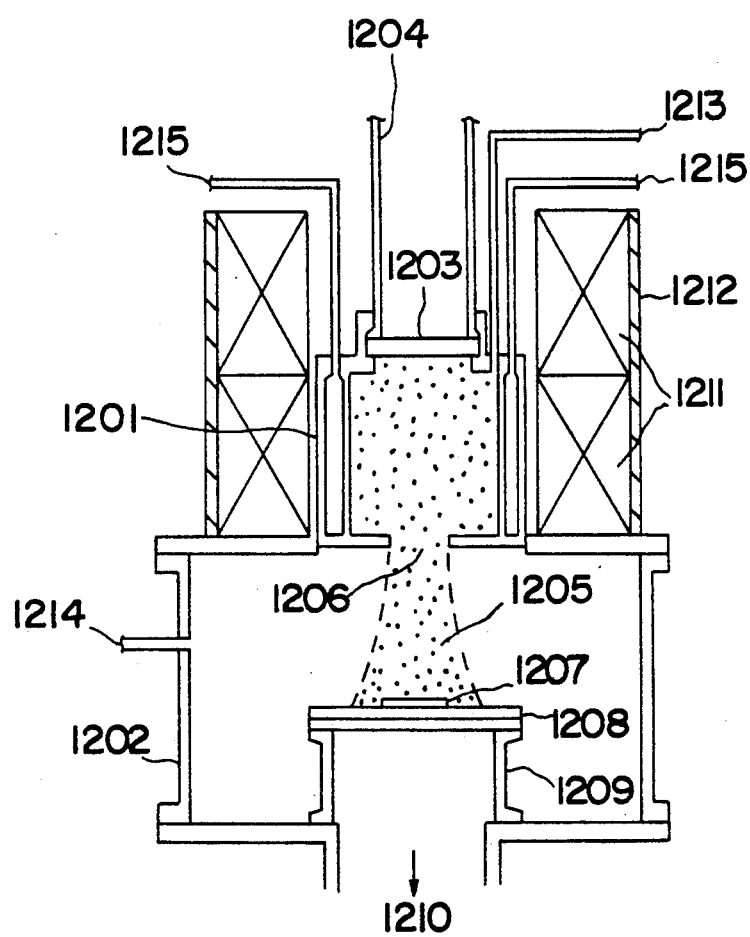
FIG. 12 is a sectional view of a conventional microwave plasma processing apparatus.

FIG. 11 shows a plasma processing apparatus in a further embodiment according to the present invention, in which ions are drawn out from a plasma produced in a discharge chamber 707 by a plurality of electrodes and a work is irradiated with the ions for processing.

Shown in FIG. 11 are a microwave-transmissive insulating inner casing 1117 for insulating a vacuum vessel 701 from a plasma produced in a discharge chamber 707, formed of quartz, alumina, boron nitride or forsterite, ion drawing electrodes 1118, 1119, and 1120 each provided with a plurality of openings optically aligned with those of the other ion drawing electrodes, dc power supplies 1121 and 1122 for applying dc voltages to the ion drawing electrodes 1119 and 1118, respectively, a processing chamber 1123, and a gas inlet port 702' opening into the processing chamber 1123.

In operation, a microwave radiated through the slit or slot of the conductive mask 704 is propagated through the interior of the insulating inner casing 1117 into the discharge chamber 707.

Then, a processing gas, for example, $N_2$ gas for depositing SiN in a film on a Si substrate, is introduced through the processing gas inlet port 702, and $SiH_4$ gas is introduced into the processing chamber 1123. Then, a plasma is produced within the discharge chamber 707 by the same action as that in the plasma processing apparatus of FIG. 7. The plasma diffuses along magnetic lines of force and reaches the ion drawing electrode 1118. Ions (principally, $N^+$ ions and $N_2^+$ ions) of the plasma absorb energy corresponding to a voltage applied to the ion drawing electrode 1118 by the dc power supply 1122. The dispersion of the ions is controlled by a voltage applied to the electrode 1119. The ions thus reaching the work 708 held on the work holder 709 combine with $SiH_4$ to deposit SiN in a film. The plasma processing apparatus need not necessarily be provided with the three ion drawing electrodes as shown in FIG. 11, by may be provided with one or two ion drawing electrodes for the same effect.

The distribution of the ions in the processing chamber 1123 is greatly dependent on the distribution of the plasma in the discharge chamber 707. The microwave is radiated through the mask 704 with a slit to produce the plasma in the discharge chamber 707 in a uniform distribution so that ion beams are distributed uniformly. When the ion beams are used for etching under a pressure on the order of $10^{-4}$ torr, the ion beams travel in the same direction and reach the work 708, whereby the work 708 is etched in the direction of travel of the ion beams for anisotropic etching.

EXAMPLE 1

The plasma processing apparatus of FIG. 1 was applied to etching an Si substrate. After mounting an Si substrate on the work holder 109, the vacuum vessel 101 was evacuated by the evacuating system 110 to a pressure of $2 \times 10^{-6}$ torr or below. Then, $Cl_2$ gas as an etching gas was supplied through the gas inlet port 102 into the vacuum vessel 101 to set the internal pressure of the vacuum vessel 101 at $3 \times 10^{-3}$ torr by regulating the conductance of the valve of the evacuating system 110. Then, the microwave oscillator was actuated to generate a microwave of 2.45 GHz in frequency and 200 W in power, the tuner of the coaxial converter with tuner was regulated to reduce the reflected power to 30 W or below. The microwave was radiated through the slit of the mask 104 to produce a plasma in the discharge chamber 107. The Si substrate was etched for a predetermined time with the $Cl^+$ ions, $Cl_2^+$ ions, $Cl^*$ radicals and $Cl_2*$ radicals, and then, the etched depth was measured. The Si substrate was etched uniformly.

EXAMPLE 2

The plasma processing apparatus of FIG. 1 was applied to ashing a novolak resist applied to an Si substrate.

The Si substrate coated with the novolak resist was mounted on the work holder 109. Then, the vacuum vessel 101 was evacuated to an internal pressure of $2 \times 10^{-6}$ torr or below. Then, 200 sccm of oxygen gas was introduced through the gas inlet port 102 into the vacuum vessel 101, while the conductance of the valve, not shown, of the evacuating system 110 was regulated to set the internal pressure of the vacuum vessel 101 at $2 \times 10^{-2}$ torr. Then, the microwave oscillator was actuated to generate a microwave of 2.45 GHz in frequency and 500 W in power. The tuner of the coaxial converter with tuner was regulated to reduce the reflected power to 30 W or below. The microwave was radiated through the slit formed in the mask 104 to produce a plasma in the discharge chamber 107. The resist was exposed to the plasma for ashing for a predetermined time with $O^+$ ions, $O_2^+$ ions, $O^*$ radicals and $O_3$ of the plasma. The resist was ashed satisfactorily uniformly.

EXAMPLE 3

The plasma processing apparatus of FIG. 1 was applied to forming an a-Si film on a quartz substrate.

A quartz substrate was mounted on the work holder 109. The vacuum vessel 101 was evacuated by the evacuating system 110 to an internal pressure of $2 \times 10^{-6}$ torr or below. Then, 20 sccm of SiH$_4$ gas and 8 sccm of hydrogen gas were supplied into the vacuum vessel 101 through the gas inlet port 102, while the conductance of the valve, not shown, of the evacuating system 110 was regulated to set the internal pressure of the vacuum container 101 at $1 \times 10^{-3}$ torr. Then, the microwave oscillator was actuated to generate a microwave of 2.45 GHz in frequency and 500 W in power, while the tuner of the coaxial converter with tuner was regulated to reduce the reflected power to 30 W or below. The microwave was radiated through the slit of the mask 104 to produce a plasma in the discharge chamber 107. The quartz substrate was exposed to the plasma for a predetermined time to deposit a-Si on the quartz substrate in a film of a predetermined thickness. The film thus formed is an a-Si:H:X film. The film was subjected to various tests. The film thus formed was uniform in thickness and homogeneous in quality.

EXAMPLE 4

The plasma processing apparatus of FIG. 7 was applied to etching a SiO$_2$ film coating an Si substrate.

First, an Si substrate was mounted on the work holder 709. Then, the vacuum vessel 701 was evacuated by the evacuating system 710 to an internal pressure of $2 \times 10^{-6}$ torr or below. Then, CHF$_3$ gas for etching was supplied through the gas inlet port 702 into the vacuum vessel 701, and the conductance of the valve, not shown, of the evacuating system was regulated to set the internal pressure of the vacuum vessel 701 at $1 \times 10^{-3}$ torr. Then, the microwave oscillator was actuated to generate a microwave of 2.45 GHz in frequency and 300 W in power, the tuner of the coaxial converter with tuner was regulated to reduce the reflected power to 30 W or below, and the microwave was radiated through the slit of the mask 704 into the discharge chamber 707 to produce a plasma in the discharge chamber 707. The SiO$_2$ film coating the Si substrate was etched for a predetermined time with ions and radicals of the plasma. It was found that the film was etched satisfactorily and uniformly.

EXAMPLE 4

The plasma processing apparatus of FIG. 7 was applied to depositing SiN in a film on an Si substrate.

First, an Si substrate was mounted on the work holder 709. Then, the vacuum vessel 701 was evacuated by the evacuating system 710 at an internal pressure of $2 \times 10^{-6}$ torr or below. Then, 30 sccm of SiH$_4$ gas and 10 sccm of nitrogen gas were supplied through the gas inlet port 102 into the vacuum vessel 701, while the conductance of the valve, not shown, of the evacuating system 710 was regulated to set the internal pressure of the vacuum vessel 701 at $1 \times 10^{-2}$ torr. Then, the microwave oscillator was actuated to generate a microwave of 2.45 GHz in frequency and 500 W in power, the tuner of the coaxial converter with tuner was regulated to reduce the reflected power to 30 W or below, and the microwave was radiated through the slit of the mask 704 to produce a plasma in the discharge chamber 707. The Si substrate was exposed to the plasma for a predetermined time to deposit SiN in a film of a predetermined thickness. The SiN film thus formed was subjected to various tests and it was found that the SiN film was compact, uniform in thickness and homogeneous in quality.

What is claimed is:

1. A plasma processing apparatus comprising:
   a vacuum vessel defining a discharge chamber, provided at least with source gas supply means for supplying a source gas into the discharge chamber, magnetic field creating means, and microwave propagating and introducing means for propagating a microwave generated by a microwave oscillator and introducing the same into the discharge chamber;
   characterized in that the microwave propagating and introducing means is encased in a conductive housing, microwave directing means is provided in a propagation path extending from the microwave oscillator to direct the microwave so that the microwave travels from the periphery of a microwave transmission window toward the center of the same, a microwave radiating member having a cut and formed in the shape of a flat plate is attached to the surface of the microwave transmission window exposed to the discharge chamber so that the microwave traveling from the periphery toward the center of the microwave transmission window is radiated completely into the discharge chamber before reaching the center of the microwave transmission window.

2. A plasma processing apparatus according to claim 1, wherein said microwave directing means provided in the propagation path to direct the microwave from the periphery toward the center of the microwave transmission window comprises a conductive flat plate, attached to the surface of the microwave transmission window so as to cover the surface of the microwave transmission window leaving a predetermined margin in the peripheral area of the surface of the microwave transmission window, and a propagating member provided on the surface of the conductive flat plate, and having one end tapered and the other end located in the propagating path.

3. A plasma processing apparatus according to claim 1, wherein the cross section of said microwave transmission window is an inverted trapezoid.

4. A plasma processing apparatus according to claim 3, wherein said microwave transmission window is formed of quartz, alumina, boron nitride, forsterite, a Zn-TiO ceramic, a Sn-TiO ceramic, a BaO-TiO$_2$ ceramic or a complex perovskite ceramic.

5. A plasma processing apparatus according to claim 1, wherein said microwave transmission window is hermetically and adhesively attached to the conductive housing by a microwave-transmissive adhesive.

6. A plasma processing apparatus according to claim 5, wherein said adhesive is a silicon resin adhesive.

7. A plasma processing apparatus according to claim 1, wherein a dielectric ring is provided in the peripheral marginal area of the microwave transmission window, serving as a microwave incidence area.

* * * * *

UNITED STATES PATENT AND TRADEMARK OFFICE
CERTIFICATE OF CORRECTION

PATENT NO. : 5,024,716
DATED : June 18, 1991
INVENTOR(S) : Yasue Sato It is certified that error appears in the above-identified patent and that said Letters Patent is hereby corrected as shown below:

COLUMN 3

Line 26, "radars" should read --radar--.

COLUMN 4

Line 35, "a" (first occurrence) should be deleted; and
Line 66, "launcher 104" should read --launcher 103--.

COLUMN 5

Line 39, "enhanced" should read --enhanced.--.

COLUMN 6

Line 51, "work 118" should read --work 108--.

COLUMN 7

Line 61, "casing 618" should read --casing 617--.

UNITED STATES PATENT AND TRADEMARK OFFICE
CERTIFICATE OF CORRECTION

PATENT NO. : 5,024,716

DATED : June 18, 1991

INVENTOR(S) : Yasue Sato

It is certified that error appears in the above-identified patent and that said Letters Patent is hereby corrected as shown below:

COLUMN 8

Line 38, "launcher 708" should read --launcher 703--; and

Line 60, "tuber" should read --tube--.

COLUMN 12

Line 11, "by" should read --but--.

Signed and Sealed this

Seventeenth Day of November, 1992

Attest:

DOUGLAS B. COMER

*Attesting Officer*     Acting Commissioner of Patents and Trademarks